United States Patent [19]

Haven et al.

[11] 4,251,610

[45] Feb. 17, 1981

[54] METHOD OF MAKING MULTICOLOR CRT DISPLAY SCREEN WITH MINIMAL PHOSPHOR CONTAMINATION

[75] Inventors: Duane A. Haven, Banks; Donald P. Chitwood, Aloha, both of Oreg.

[73] Assignee: Tektronix, Inc., Beaverton, Oreg.

[21] Appl. No.: 90,709

[22] Filed: Nov. 2, 1979

[51] Int. Cl.³ .............................................. G03C 5/00
[52] U.S. Cl. ......................................... 430/25; 354/1; 427/68; 430/24
[58] Field of Search ....................... 430/24, 25; 354/1; 427/68, 64

[56] References Cited

U.S. PATENT DOCUMENTS

| | | | |
|---|---|---|---|
| 3,005,708 | 10/1961 | Hesse | 430/24 |
| 3,146,368 | 8/1964 | Fiore et al. | 430/25 X |
| 3,287,130 | 11/1966 | Kaplan | 430/24 |
| 3,558,310 | 1/1971 | Mayaud | 430/25 |
| 3,615,461 | 10/1971 | Kaplan | 430/25 X |
| 3,615,462 | 10/1971 | Szegho et al. | 430/25 X |
| 3,632,339 | 1/1972 | Khan | 430/25 |
| 3,767,395 | 10/1973 | Rowe et al. | 430/24 |
| 4,150,990 | 4/1979 | Stetz | 427/68 |

Primary Examiner—Edward C. Kimlin
Attorney, Agent, or Firm—John D. Winkelman

[57] ABSTRACT

An improved method of forming a multicolor cathode-ray tube display screen to minimize phosphor contamination. A light-absorbing matrix is first formed on the inner surface of a CRT faceplate, preferably by photo-etching of a substantially black metallic layer. Then, multiple color dot patterns are deposited in the matrix openings by (a) depositing a layer of positive photoresist on the matrix and any previously-deposited dot pattern; (b) exposing the resist through a shadow mask to light from a point source positioned to simulate an electron gun; (c) developing the resist to form an integral mask containing a pattern of holes aligned with the matrix openings for one color phosphor; (d) coating the developed resist layer with a photohardenable phosphor slurry; (e) exposing the slurry coating through the faceplate to light from a diffuse source; (f) developing the slurry to remove the unexposed portions, leaving a pattern of dots of one color; and (g) stripping away the photoresist masking layer. Steps (a) through (g) are then repeated to produce each additional color dot pattern.

10 Claims, 8 Drawing Figures

METHOD OF MAKING MULTICOLOR CRT DISPLAY SCREEN WITH MINIMAL PHOSPHOR CONTAMINATION

BACKGROUND AND OBJECTS OF THE INVENTION

The present invention relates generally to the manufacture of display screens for cathode-ray tubes, and more particularly to an improved method for making multicolor CRT display screens having minimal phosphor contamination. The invention has particular utility in the production of phosphor dot screens for high resolution color display tubes of the shadow mask type, and especially to "black surround" versions of them. For that reason, the invention will be described primarily with reference to the manufacture of such screens.

A conventional dot screen type color display tube includes three electron guns arranged in a delta configuration. The three guns project a like number of electron beams through a shadow mask onto a display screen comprising a mosaic pattern of phosphor deposits arranged in a multiplicity of dot triads. Each triad includes a dot of a red-, a green-, and a blue-emitting phosphor. For improved display brightness, the screen may include a matrix layer of light-absorbing material that surrounds and separates the phosphor dot deposits. Such a screen, which has come to be known as a "black surround" screen, is the subject of U.S. Pat. No. 3,146,368 to Fiore et al.

The mosaic phosphor dot pattern of a dot-screen tube normally is formed by a direct photoprinting process that proceeds substantially as follows: A screen area on the inner surface of the faceplate is first coated with a photosensitive slurry containing phosphor particles of one color. Next, the tube's shadow mask is mounted on the faceplate temporarily and the coating is exposed to ultravoilet light projected through the mask apertures from a source located at a position corresponding to that of the related electron gun. The shadow mask is then removed and the coating treated to remove the unexposed portions, leaving a pattern of dots of one phosphor color. These steps are repeated for each remaining color to deposit a triangular group of three phosphor dots—a red, a green, and a blue—on the faceplate opposite each mask aperture.

Normal practice is to make the individual phosphor dots smaller in size than the corresponding mask apertures. This is generally accomplished by exposing the dots through a shadow mask that has apertures of a temporarily smaller size. Then, after the phosphor dots are deposited, the mask is re-etched to enlarge the apertures to a final, larger size. Re-etching of shadow mask apertures is shown in U.S. Pat. No. 2,961,313 to Amdursky, for example. An alternative procedure is to reduce the diameter of the shadow mask holes temporarily by electroplating, as described in U.S. Pat. No. 3,231,380 to Law, or by electrophoretic coating with a non-metallic material, as taught by U.S. Pat. No. 3,070,441 to Schwartz. The size of the phosphor dots also can be made smaller without modifying the shadow mask by very careful control of the light exposure step. See, for example, previously mentioned U.S. Pat. No. 3,146,368.

Black surround screens have been made in a variety of ways, but the usual procedure is to form the light-absorbing matrix layer before depositing the phosphor dots. For example, as described in U.S. Pat. No. 3,558,310 to Mayaud, the screen area of the faceplate is coated first with a photohardenable material, such as dichromate-sensitized polyvinyl alcohol (pva). With the shadow mask mounted in position, the coating is given three separate exposures, one from each electron gun position. The mask is then removed and the unexposed portions of the coating washed off, leaving a pattern of hardened pva dots. The dot pattern is covered with a light-absorbing coating of colloidal graphite, which is dried and then treated with a chemical agent, such as hydrogen peroxide, to remove the pva dots and the overlying portions of the graphite coating. This provides the screen area with a light-absorbing matrix layer having a pattern of openings for receiving the color phosphor dots, which are then deposited as previously described.

Screening methods of the prior art as described have a number of limitations, particularly when applied to the production of high resolution display screens and those requiring superior color quality. For example, to build a color CRT with double the resolution of a standard entertainment-type tube, phosphor dot density must be increased by a factor of four and dot size reduced accordingly. Decreasing phosphor dot size is not simply a matter of using a shadow mask with smaller apertures, however, Diffraction effects make it necessary to decrease aperture size more than a factor of two to achieve a 2× reduction in dot size using standard screening methods. Moreover, these effects increase with decreasing aperture size, so that it would be necessary to use extremely small apertures to facricate a screen with dots one-quarter the diameter of those in an equivalent size entertainment TV tube. The resulting dots would tend to be irregular and nonuniform in diameter because of the effects of edge diffraction on the pva exposure process.

Another limitation of prior art processes applicable to normal and high resolution screens alike is contamination of the various color phosphor deposits during processing. For example, as pointed out in U.S. Pat. No. 3,615,462 to Szegho et al., the phosphor dots may become contaminated by particles of light-absorbing pigment released from the black surround layer during the phosphor screening steps. That patent proposes the use of a clear, volatilizable protective overcoating on the pigmented layer to overcome the problem. While perhaps effective for the intended purpose (at a cost of increased process complexity) it does nothing to prevent cross-contamination of the phosphors themselves, a more serious problem when color purity is a paramount objective.

Still another limitation of conventional screening processes is that the phosphor dots are formed by a "front" exposure—i.e., by light directed onto the free surface of a photosensitive layer. Because the photopolymerization process begins at the side of the layer nearest the light source and proceeds through the layer to the support as the exposure continues, exposure and coating uniformity must be tightly controlled if well-adhered dots of uniform size are to be obtained. Underexposure or an overly-thick photosensitive layer may produce dots that fail to adhere to the faceplate. Overexposure (or a too-thin layer) causes overly-large dots with ragged edges. Light diffraction produced by exposure through small mask apertures greatly increases these problems. Thus, the resolution of large screen ($\geqq$12 in. dia.) CRT screens is limited as a practical matter by conventional process technology to matrixes composed of 0.006 in. dia. dots on 0.012 in. centers.

A general object of the present invention is, therefore, to provide an improved color display screening process that is free of the drawbacks enumerated above.

A more specific object of the invention is to provide a novel method for applying a pattern of uniform, well defined deposits on the faceplate of a cathode-ray tube.

Another significant object of the invention is to provide a method for screening shadow mask multicolor display CRT's that minimizes the possibility of contaminating the phosphor deposits.

Still another object of the invention is to provide a method for manufacturing very high resolution multicolor CRT display screens.

A further object of the invention is to provide an improved screening method utilizing a through-the-faceplate exposure to form multicolor phosphor deposits in a black surround screen.

SUMMARY OF THE INVENTION

In forming a multicolor CRT display screen in accordance with the preferred practice of the present invention, a light-absorbing matrix or black surround layer is first formed on the inner surface of the CRT faceplate. The matrix suitably is made by depositing a black metallic material, such as black chromium, on the faceplate's inner surface, coating the metal layer with a positive photoresist, and exposing the resist coating in the usual manner to light projected through a temporarily-mounted shadow mask. After removing the mask, the resist layer is developed to remove a pattern of areas corresponding to the shadow mask apertures, and the thus-uncovered regions of the black metallic layer are etched away to define the black surround matrix.

Next, a display screen compising a mosaic pattern of color phosphor deposits is formed on the faceplate in the following manner. The light-absorbing matrix is covered with a layer of positive-acting photoresist. After again mounting the shadow mask on the faceplate, the resist layer is exposed to light projected through the mask from a source positioned to simulate one of the CRT's electron guns. The shadow mask is then removed and the resist layer developed to remove the exposed areas and form an integral mask for the formation of a first phosphor element pattern. A slurry of single color phosphor particles in a photohardenable material is applied in a layer covering the resist mask, after which the slurry layer is back-exposed to diffuse light transmitted through the faceplate and the open areas of the photoresist mask. Finally, the exposed slurry layer is developed and the mask stripped away to leave a pattern of phosphor dots of one color adhered to the faceplate in registration with corresponding apertures in the black surround layer. The screening process is completed by repeating the just-described sequence twice more—once for each of the remaining phosphor colors.

A significant aspect of the invention is that cross-contamination of the phosphor deposits is essentially eliminated, since any residual phosphor remaining after development of the slurry layer is removed when the integral mask is stripped away. Further, already-deposited phosphor dots are completely covered during the formation of subsequent dot patterns, minimizing the opportunity for contamination.

Further objects, features and advantages of the present invention will become evident as the following detailed description is read in conjunction with the accompanying drawings.

DESCRIPTION OF PREFERRED EMBODIMENT

Figure 1:
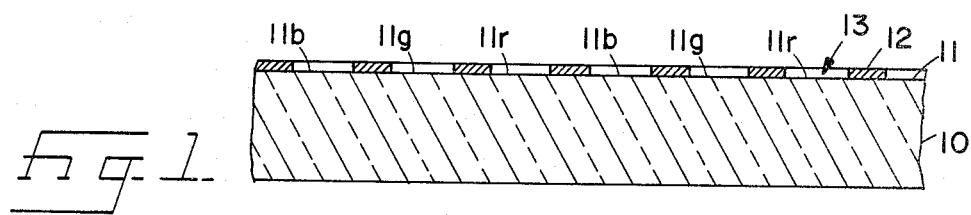
FIGS. 1-6 are similar fragmentary cross-sectional views of a cathode-ray tube faceplate showing different stages in the screening method of the invention.

Color display tubes of the shadow mask type have a target screen that typically includes a light absorbing matrix containing an array of openings filled with color-emitting phosphor materials. Generally, the phosphor deposits are in the form of small dots arranged to define a multiplicity of triads, although other arrangements are also used. The envelope of such a tube includes a transparent faceplate section on which the screen is formed before being sealed to the main funnel section. A fragmentary portion of such a faceplate is indicated at 10 in FIG. 1.

The process of forming a color dot display screen on faceplate 10 in accordance with the best mode presently contemplated for practicing the invention begins with the formation of a light-absorbing layer, or matrix, 12 on the inner surface 11 of the faceplate. As will be understood, matrix 12 includes a pattern of substantially circular openings 13 defining three sets of elemental areas 11$b$, 11$g$, 11$r$ that are to receive deposits of color phosphor materials. Although the light-absorbing layer may be produced in a variety of ways, a preferred method is to apply a light-absorbent metallic film to the faceplate's inner surface 11, and then form the desired pattern of openings 13 by photoetching.

By way of specific example, about 2,000 angstroms of black chromium is deposited on surface 11 by cathodic sputtering in an oxygen/argon mixture at a pressure of about $5 \times 10^{-3}$ torr. This produces an opaque, light-absorbent film from which matrix 12 will be formed. The metal film is coated with a positive-acting, high resolution photoresist, such as Shipley AZ1350J, and is then baked to remove residual solvents from the coating. After temporarily attaching a shadow mask to the faceplate, the assembly is mounted in an exposure chamber of conventional design. The photoresist coating is there exposed to collimated light projected through the mask apertures from three locations related to those of the electron guns in the CRT being processed. Following its exposure, the photoresist coating is developed in a suitable solvent to remove the irradiated portions. This uncovers the corresponding portions of the underlying metal film, which are then removed by etching. Finally, the remaining photoresist is stripped from the faceplate using a suitable solvent (acetone in the case of the Shipley resist), resulting in the structure shown in FIG. 1. Faceplate 10 now is in condition to receive the various color phosphor deposits required in the final screen structure.

Figure 2:
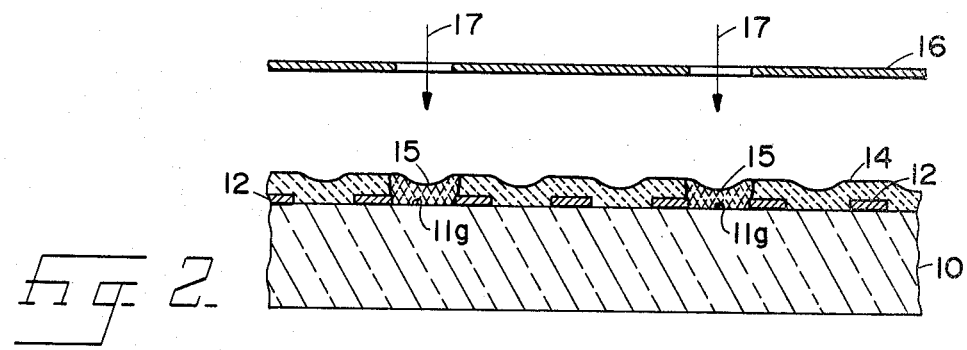

Referring next to FIG. 2, light-absorbing matrix 12 and faceplate surface areas 11$b$, 11$g$, 11$r$ are coated with a layer 14 of a positive-acting, high resolution photoresist—e.g., Shipley AZ1350J or the equivalent. After removal of residual solvents by baking, the photoresist layer is exposed through previously-used mask 16 to ultraviolet light (indicated by arrows 17) from a small area, or "point", source located to simulate a selected one of the CRT's electron guns, herein the "green" gun. The exposure produces a developable pattern of layer portions 15 at sites overlying faceplate surface areas 11g. These elemental surface areas, which are intended to receive deposits of green-emitting phosphor, are next uncovered by developing the exposed photoresist layer. Development of layer 14 removes portions 15 and produces a pattern of openings aligned with the mask openings 13 that define areas 11g. The development step is conventional, and consists essentially of treating the photoresist layer with an appropriate solvent, such as Shipley AZ Developer, rinsing in running water and drying.

After photoresist layer 14 has been developed, a photosensitive slurry of a green-emitting phosphor is coated on the faceplate's screen area to form a layer 18 (FIG. 3) covering elemental areas 11g and the unexposed portions of the resist layer. The photosensitive component of slurry layer 18 is a negative-acting resist—one that becomes insoluble in a given solvent upon exposure to actinic radiation. Suitable resist materials include polyvinyl alcohol (pva) sensitized with ammonium dichromate, and commercial negative-acting resists such as Kodak 747. As will be understood, it is most desirable that the negative resist of layer 18 not interact adversely with the positive resist constituting layer 14.

Faceplate 10 next is placed opposite a bank of ultraviolet light-emitting lamps with the matrix and photoresist layers on the side of the faceplate remote from the lamps. Diffuse ultraviolet light flooding the faceplate, as indicated by arrows 19 in FIG. 3, exposes and thereby insolubilizes the portions of phosphor slurry layer 18 overlying inner surface areas 11g. Matrix 12 and developed photoresist layer 14 block the light from reaching the remainder of layer 18. By way of explanation, the exemplified positive-acting photoresist, AZ 1350-J, in its unexposed state is substantially opaque to radiation having a wavelength shorter than about 4250 angstroms. The patterned resist layer 14 thus functions as an integral mask to prevent such radiation from exposing corresponding portions of the slurry layer. Following the exposure step, slurry layer 18 is developed by spraying the surface with a suitable solvent (water if a pva slurry is used; xylene in the case of K747 resist) to remove the unexposed portions of the layer and leave a pattern of green phosphor deposits 20 on the screen surface. Masking layer 14 then is stripped from the support to produce the structure shown in FIG. 4.

Figure 3:
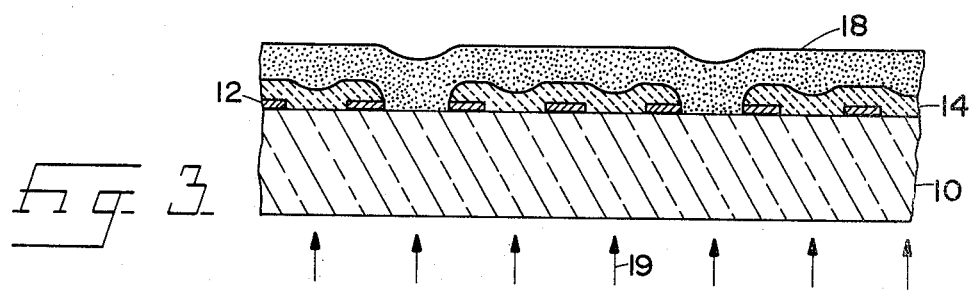
Figure 4:
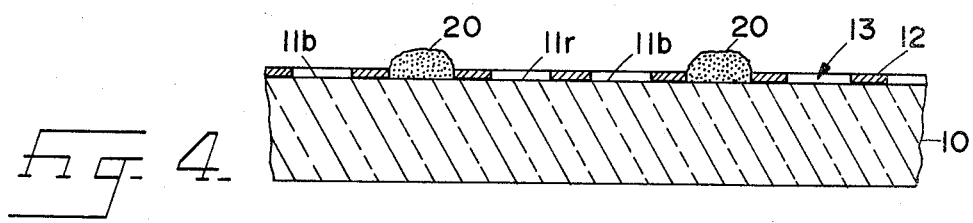
Figure 5:
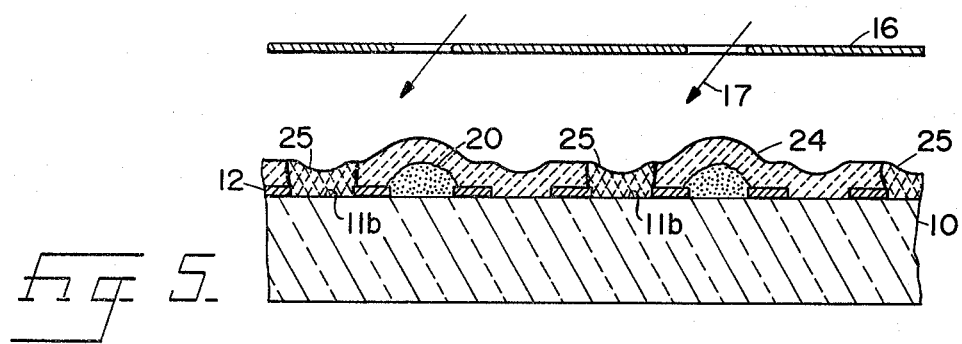
Figure 6:
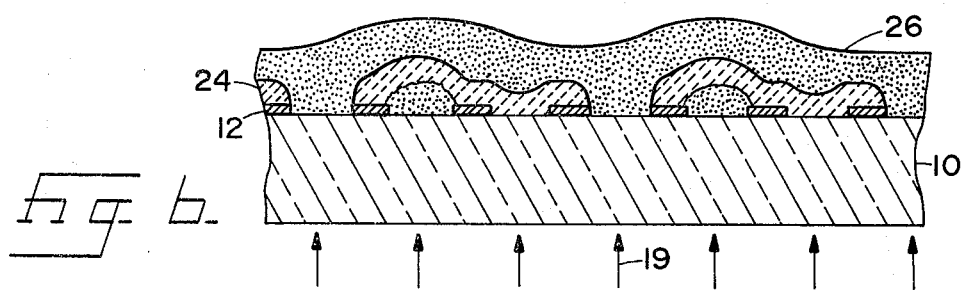
Figure 7:
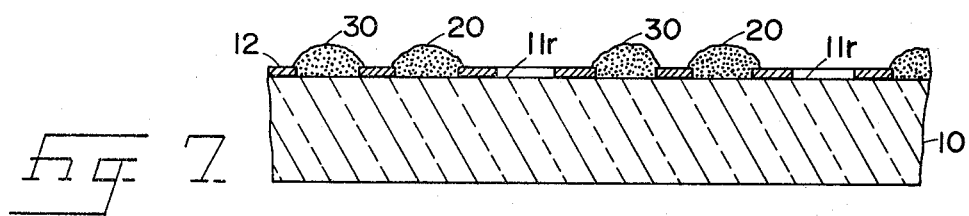
FIG. 7 is a fragmentary cross-sectional view of a multicolor dot screen prepared by the method illustrated in FIG. 1-6.

The process described in connection with FIGS. 2-4 now is repeated to deposit phosphor dots of a second color—blue, for example—on faceplate surface areas 11b. Thus, referring to FIG. 5, a new layer 24 of positive-acting photoresist is applied to faceplate 10 and exposed through mask 16. For this exposure, however, the point source is shifted to a location simulating that of the "blue" electron gun. Photoresist layer 24 is then developed to remove exposed portions 25 and uncover the underlying elemental surface areas 11b. The screen surface next is coated with a photosensitive slurry layer 26 of a blue-emitting phosphor, and exposed by diffuse radiation 19 directed through the opposite side of the faceplate, as shown in FIG. 6. Development of the slurry layer to remove the unexposed portions produces a pattern of blue phosphor deposits 30 adhered to faceplate surface areas 11b. The remainder of photoresist layer 24 is then removed with a solvent, resulting in the intermediate screen structure of FIG. 7.

Figure 8:
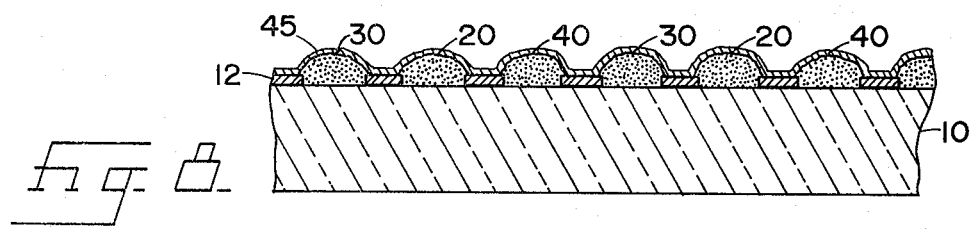
FIG. 8 shows the completed screen structure.

Finally, the sequence is repeated to form deposits 40 of red-emitting phosphor on screen surface areas 11r of the faceplate. The completed screen structure, shown in FIG. 8, includes a light-absorbing matrix 12 embodying an array of openings filled with phosphor deposits 20, 30, 40 of different colors in a regular dot triad pattern. In accordance with preferred practice, an electron-transparent layer 45 of aluminum covers the entire rear surface of the screen to provide increased brightness and serve as a convenient means for applying an elevated operating potential to the screen.

As will by now be evident, the possibility of phosphor contamination is minimized, if not eliminated, by the disclosed screening method. Phosphor particles that remain adhered to the integral mask (e.g., positive resist layer 14 or 24) following development of the slurry layer are removed when the resist mask is subsequently stripped from the screen surface. In addition, once a phosphor dot pattern has been formed on the screen, it is protected against cross-contamination by the integral mask(s) used to define any subsequent dot pattern(s). Contamination of the phosphor deposits by black surround material is avoided by forming the matrix from a thin, non-particulate metallic layer, suitably black chrome.

An additional benefit of the disclosed process is that a "back" or through the faceplate exposure is used to form the phosphor dots. This insures that the deposits are well adhered to the faceplate and will not be removed by further processing, even if they are very small in diameter.

In the exemplified embodiment, advantage is taken of the positive photoresist's inherent ability to mask radiation having a wavelength shorter than about 4,250 angstroms. An alternative approach is to treat the developed positive resist layers (e.g., layers 14 or 24) with a dye that absorbs actinic light. This permits the integral masking layer to be formed of positive-acting resists that are not sufficiently opaque at wavelengths to which the overlying photohardenable slurry is sensitive.

Obviously, numerous other modifications and variations of the present invention are possible in light of the above teachings. It is therefore to be understood that with the scope of the appended claims the invention may be practiced otherwise than as specifically described herein.

We claim as our invention:

1. A method of manufacturing a display screen for a cathode-ray tube, comprising the steps of:

forming on a transparent support a light-absorbing layer that includes a plurality of light-transmissive openings, coating the light-absorbing layer with a first continuous layer of a photosensitive material, exposing portions of said first layer to actinic radiation at locations overlying said light-transmissive openings, treating said first layer to remove the exposed portions thereof and form a plurality of openings individually aligned with those of said light-absorbing layer, coating the remaining portions of said first layer with a second continuous layer of a photosensitive material, passing actinic radiation through said support and light-transmissive openings to expose portions of the second layer defined by the aligned openings, and treating said second layer to remove the unexposed portions thereof while retaining the exposed portions within said aligned openings.

2. The method of claim 1, wherein said second layer is comprised of a luminescent material dispersed in a photohardenable binder.

3. The method of claim 1 or 2, wherein said first layer comprises a material whose solubility in a solvent is increased by exposure to actinic radiation.

4. A method of manufacturing a display screen for a cathode-ray tube of the type wherein said screen comprises an array of phosphor elements disposed on the inner surface of the tube's faceplate, separated from one another by light-absorbing material comprising the steps of:

forming a matrix layer of light-absorbing material on said inner surface, said layer including an array of openings at separated locations on said surface for receiving said phosphor elements, covering said matrix layer and faceplate surface locations with a first layer of a photosensitive material whose solubility in a solvent is increased by exposure to actinic radiation, exposing said first layer to actinic radiation at selected locations corresponding to certain of said surface locations, treating said first layer to remove the exposed portions thereof and uncover said inner surface at the selected locations, covering the remaining portions of said first layer and the uncovered portions of said surface with a second layer comprising a phosphor material dispersed in a photosensitive binder whose solubility in a solvent is decreased by exposure to actinic radiation, transmitting actinic radiation through said faceplate to expose said second layer selectively at said certain inner surface locations, treating said second layer to remove the unexposed portions thereof while retaining the exposed portions, and removing the remaining portions of said first layer.

5. The method of claim 4, wherein said matrix layer is of a metallic material.

6. A method of manufacturing a display screen for a cathode-ray tube of the type wherein said screen comprises an array of phosphor elements disposed on the inner surface of the tube's faceplate, separated from one another by light-absorbing material, and wherein an apertured shadow mask is mounted within said tube in spaced relation to said screen, comprising the steps of:

forming a matrix layer of light-absorbing material on said inner surface, said layer including an array of openings defining separated areas of said surface for receiving said phosphor elements, covering said matrix layer and faceplate surface areas with a first layer of a photosensitive material whose solubility in a solvent is increased by exposure to actinic radiation, exposing said first layer to actinic radiation transmitted through certain apertures of a shadow mask mounted adjacent said inner surface to form in said layer a pattern of developable latent images at locations corresponding to certain of said surface areas, developing said latent images to remove the corresponding portions of said first layer and uncover said inner surface areas at the selected locations, covering the remaining portions of said first layer and the uncovered areas of said surface with a second layer comprising a phosphor material dispersed in a photosensitive binder whose solubility in a solvent is decreased by exposure to actinic radiation, transmitting actinic radiation through said faceplate to expose said second layer at the selected inner surface locations, developing said second layer to remove the unexposed portions thereof while retaining the exposed portions, and removing the remaining portions of said first layer.

7. The method of claim 6, wherein said matrix layer is formed by steps including:

applying a light-absorbing metallic film to said inner surface, covering said metallic film with a layer of a photosensitive material whose solubility in a solvent is increased by exposure to actinic radiation, mounting said shadow mask adjacent said inner surface, exposing said photosensitive layer to actinic radiation transmitted through the apertures of said mask, developing said layer to remove the exposed portions thereof and uncover said metallic film at locations corresponding to said separated surface areas, removing the uncovered portions of said metallic film, and removing the remaining portions of said photosensitive layer.

8. The method of claim 6, wherein said first layer of photosensitive material is substantially opaque to radiation that is capable of rendering said photosensitive binder insoluble, and wherein said second layer is exposed using such radiation.

9. The method of claim 6, wherein each of the steps following formation of said matrix layer is repeated to deposit multiple, interleaved phosphor element patterns of different emission characteristics.

10. The method of claim 9, wherein said phosphor element patterns comprise dot patterns of different color-emitting phosphors.

* * * * *

UNITED STATES PATENT AND TRADEMARK OFFICE
CERTIFICATE OF CORRECTION

PATENT NO. : 4,251,610
DATED : February 17, 1981
INVENTOR(S) : Duane Austin Haven and Donald P. Chitwood It is certified that error appears in the above-identified patent and that said Letters Patent are hereby corrected as shown below:

Col. 2, line 27, change "however," to --however.--.

Col. 2, line 32, change "facricate" to --fabricate--.

Col. 3, line 36, change "compising" to --comprising--.

Col. 6, line 44, change "with" to --within--.

Signed and Sealed this

Twelfth Day of May 1981

[SEAL]

Attest:

RENE D. TEGTMEYER

Attesting Officer

Acting Commissioner of Patents and Trademarks